(12) United States Patent
Senoo et al.

(10) Patent No.: US 11,637,269 B2
(45) Date of Patent: Apr. 25, 2023

(54) DISPLAY DEVICE AND MANUFACTURING METHOD THEREFOR

(71) Applicant: SHARP KABUSHIKI KAISHA, Sakai (JP)

(72) Inventors: Tohru Senoo, Sakai (JP); Takeshi Hirase, Sakai (JP); Hisao Ochi, Sakai (JP); Takashi Ochi, Sakai (JP); Tohru Sonoda, Sakai (JP); Akihiro Matsui, Sakai (JP); Yoshinobu Miyamoto, Sakai (JP); Jumpei Takahashi, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 131 days.

(21) Appl. No.: 17/055,947

(22) PCT Filed: May 23, 2018

(86) PCT No.: PCT/JP2018/019905
§ 371 (c)(1),
(2) Date: Nov. 16, 2020

(87) PCT Pub. No.: WO2019/224963
PCT Pub. Date: Nov. 28, 2019

(65) Prior Publication Data
US 2021/0210724 A1 Jul. 8, 2021

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3258* (2013.01); *H01L 51/56* (2013.01); *H01L 27/3246* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 10,269,881 B2 * | 4/2019 | Go | H01L 27/3276 |
| 2014/0131672 A1 * | 5/2014 | Yoon | H01L 27/3262 438/34 |
| 2017/0194599 A1 * | 7/2017 | Furuie | H01L 51/5253 |
| 2018/0287093 A1 * | 10/2018 | Lee | H01L 51/5225 |
| 2020/0358030 A1 * | 11/2020 | Okabe | H05B 33/22 |

FOREIGN PATENT DOCUMENTS

JP 2014-225380 A 12/2014

* cited by examiner

*Primary Examiner* — Michelle Mandala
(74) *Attorney, Agent, or Firm* — ScienBiziP, P.C.

(57) ABSTRACT

An organic EL display device includes an organic EL element disposed on a flattening film, and a sealing film disposed over the organic EL element, a display region, and a frame region disposed around the display region. The frame region includes a plurality of mask spacers. The flattening film has a recess disposed between the display region and the mask spacers adjacent to the display region. The recess is filled with an organic film.

10 Claims, 9 Drawing Sheets

DISPLAY DEVICE AND MANUFACTURING METHOD THEREFOR

TECHNICAL FIELD

The present disclosure relates to a display device and a method for manufacturing the display device.

BACKGROUND ART

Attention has been recently drawn to self-emission organic EL display devices using organic electroluminescence (EL) elements, as display devices instead of liquid-crystal displays. To prevent deterioration of an organic EL element resulting from contaminations of moisture, oxygen, and other things, a proposed sealing structure has a sealing film for covering the organic EL element. The sealing film consists of a stack of organic and inorganic films.

Patent Literature 1 discloses an example material applicable to such an organic film of the sealing film. This material is a sealant that is intended for use in an organic EL display element, is easy to apply through ink jetting, is highly curable, and has high capabilities of making a cured object transparent and protecting the object.

CITATION LIST

Patent Literature

Patent Literature 1: Japanese Patent Application Laid-Open No. 2014-225380

SUMMARY

Technical Problem

The capability of forming an organic film through ink jetting is susceptible to the condition of a target surface for formation; hence, precisely forming the edge of the organic film is difficult. Thus, an organic resin material (application ink) spreads on a flattening film at the edge in a manner different from that in a display region; ink thickness is hence reduced, easily producing a chipped organic film.

To solve this problem, it is an object of the present disclosure to provide a display device that can improve the spread of an application ink to prevent a chipped organic film. It is also an object of the present disclosure to provide a method for manufacturing the display device.

To solve the problem, a display device according to the present disclosure includes the following: a base substrate; a plurality of switching elements disposed on the base substrate; a flattening film disposed on the plurality of switching elements; a light-emitting element disposed on the flattening film; a sealing film disposed over the light-emitting element, and has a stack of, in sequence, a first inorganic film, an organic film, and a second inorganic film; a display region; and a frame region disposed around the display region. The frame region includes a plurality of mask spacers. The flattening film has a recess disposed between the display region and the plurality of mask spacers adjacent to the display region. The recess is filled with the organic film.

Advantageous Effect

The present disclosure improves the spread of an organic resin material of the organic film when the organic film is formed through ink jetting. This can prevent chipping in the organic film.

DESCRIPTION OF EMBODIMENTS

Embodiments of the present disclosure will be detailed with reference to the drawings. The present disclosure is not limited to the following embodiments.

First Embodiment

Figure 1:
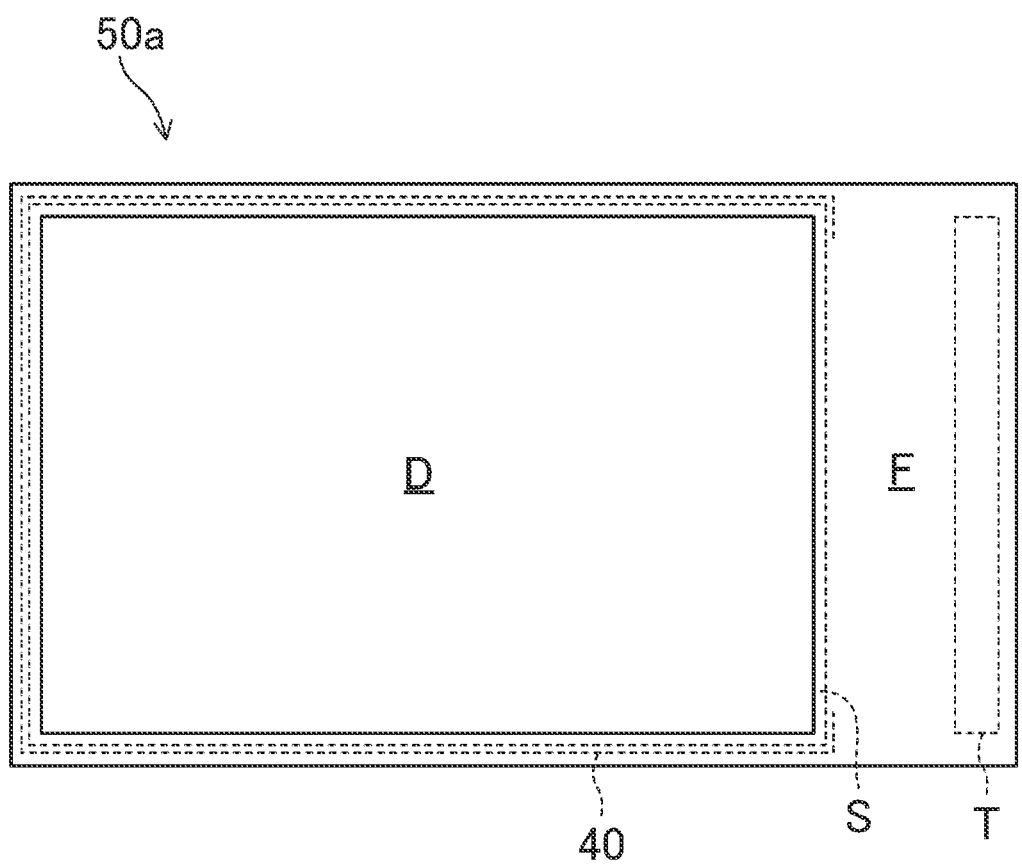
FIG. 1 is a plan view of an organic EL display device according to a first embodiment.
Figure 2:
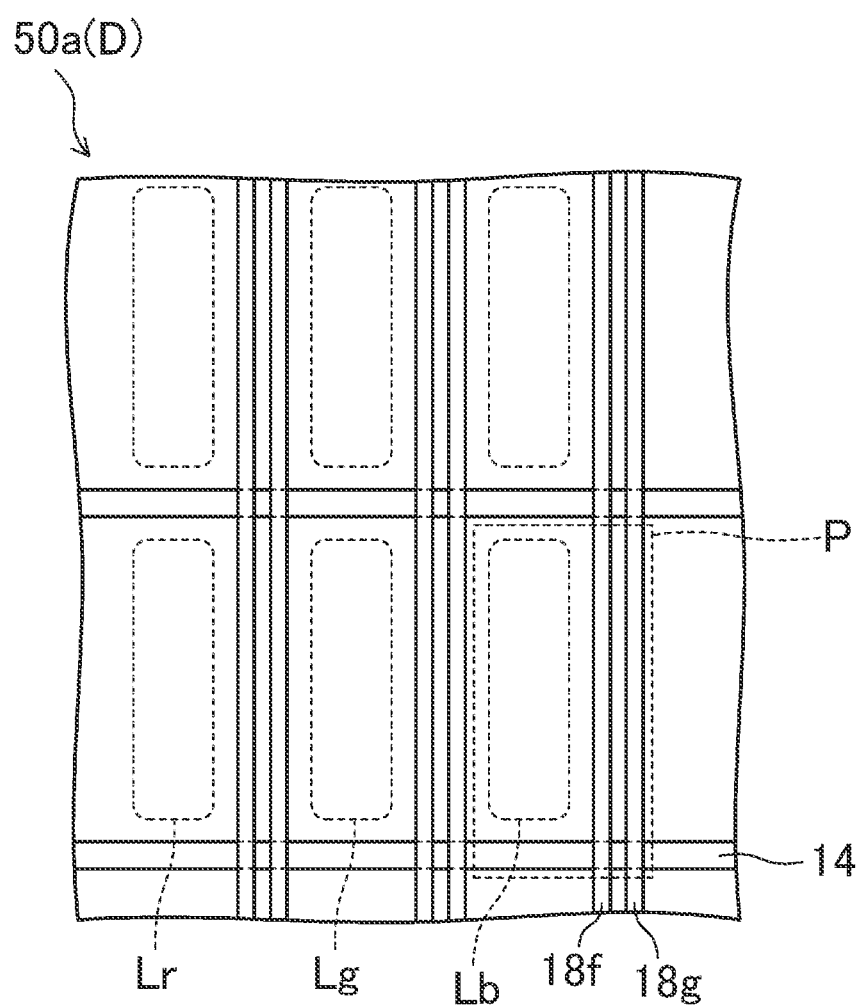
FIG. 2 is a plan view of a display region of the organic EL display device according to the first embodiment.
Figure 3:
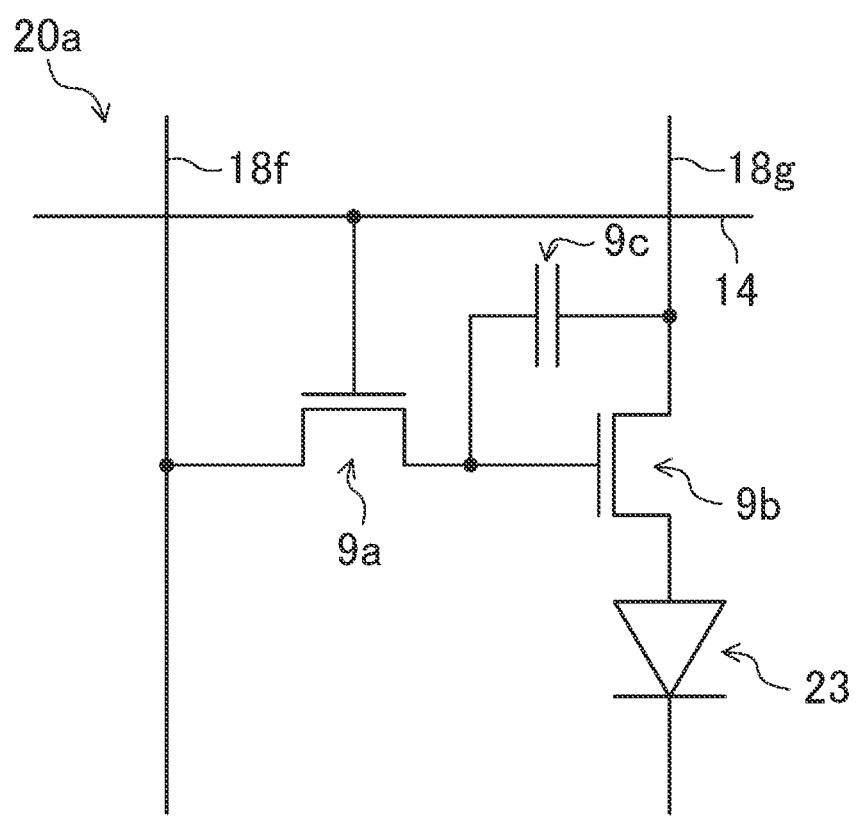
FIG. 3 is an equivalent circuit diagram of a TFT layer forming the organic EL display device according to the first embodiment.
Figure 4:
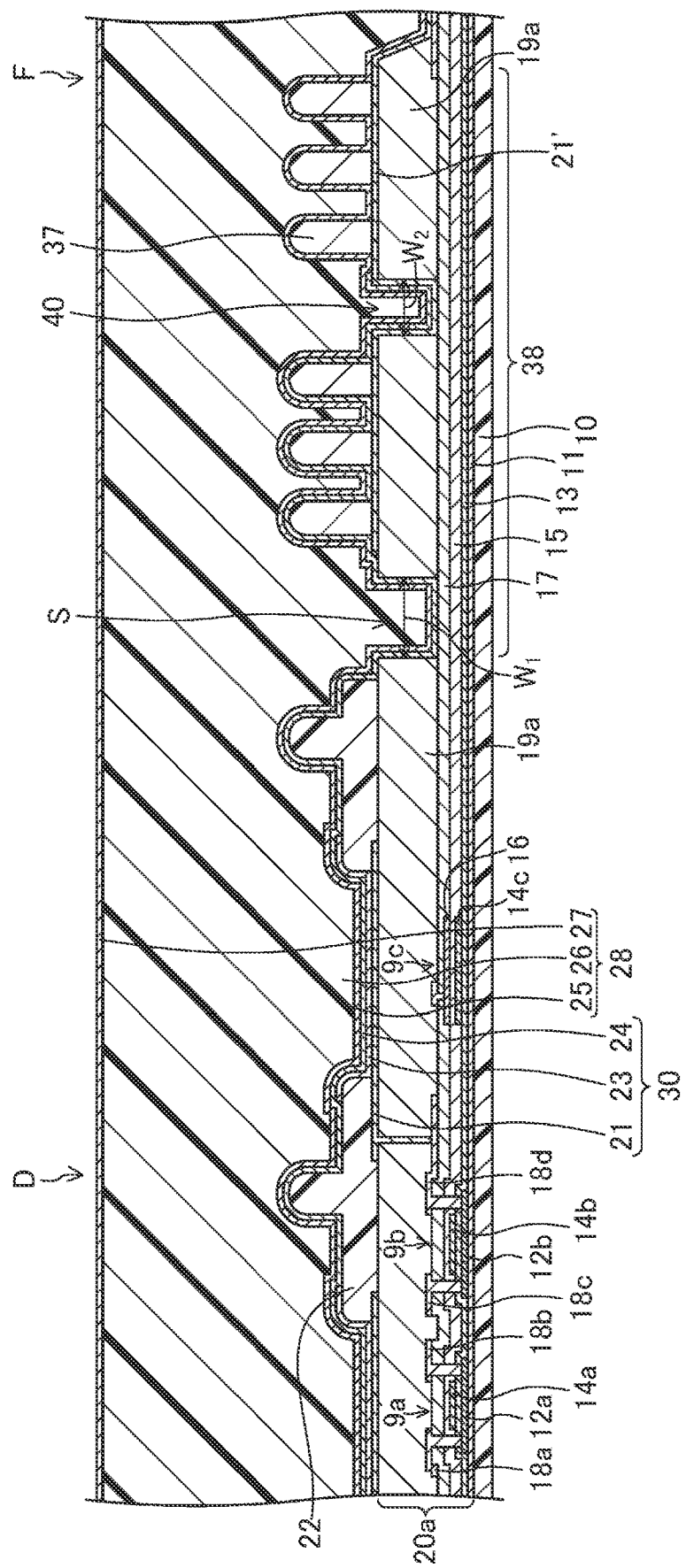
FIG. 4 is a cross-sectional view of the boundary between the display region and a frame region of the organic EL display device.
Figure 5:
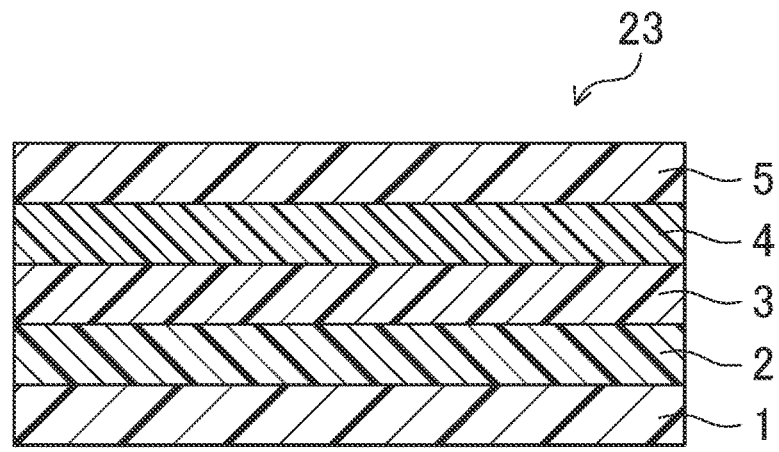
FIG. 5 is a cross-sectional view of an organic EL layer forming the organic EL display device according to the first embodiment.
Figure 6:
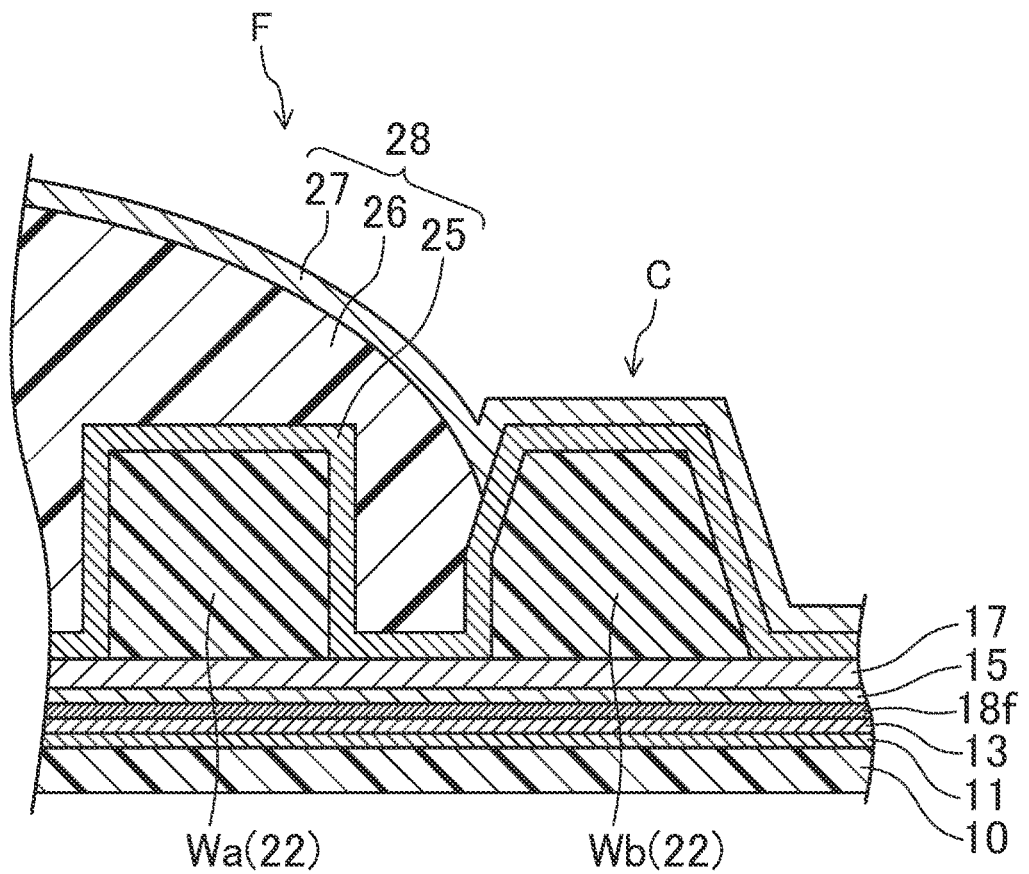
FIG. 6 is a cross-sectional view of the frame region (blockage region) of the organic EL display device according to the first embodiment.

FIGS. 1 to 6 illustrate a first embodiment of a display device according to the present disclosure. Each embodiment describes, by way of example, an organic EL display device that includes organic EL elements, as a display device that includes light-emitting elements. FIG. 1 is a plan view of an organic EL display device 50a according to this embodiment. FIG. 2. is a plan view of a display region D of the organic EL display device 50a. FIG. 3 is an equivalent circuit diagram of a TFT layer 20a forming the organic EL display device 50a. FIG. 4 is a cross-sectional view of the boundary between the display region D and a frame region F of the organic EL display device 50a. FIG. 5 is a cross-sectional view of an organic EL layer 23 forming the organic EL display device 50a. FIG. 6 is a cross-sectional view of the frame region (blockage region) of the organic EL display device 50a.

As illustrated in FIG. 1, the organic EL display device 50a includes the display region D having a rectangular shape and provided for image display, and includes the frame region F disposed around the display region D. The frame region F has an end, on the right side of FIG. 1, at which a terminal section T is disposed.

The organic EL display device 50a have a plurality of sub-pixels P arranged in matrix in the display region D, as illustrated in FIG. 2. As illustrated in FIG. 2, the organic EL display device 50a also has, in the display region D, a sub-pixel P with a red light-emission region Lr for red display, a sub-pixel P with a green light-emission region Lg for green display, and a sub-pixel P with a blue light-emission region Lb for blue display. These sub-pixels P are adjacent to each other.

These three adjacent sub-pixels P with the red light-emission region Lr, the green light-emission region Lg, and the blue light-emission region Lb constitute one pixel in the display region D of the organic EL display device 50a.

As illustrated in FIG. 4, the organic EL display device 50a includes a base substrate 10, and an organic EL element 30 disposed on the base substrate 10 via a thin-film-transistor (TFT) layer 20a.

The resin substrate layer 10 is made of, for instance, polyimide resin and provided as a resin substrate.

The TFT layer 20a includes the following components, as illustrated in FIG. 4: a base coat film 11 disposed on the resin substrate 10; a plurality of first TFTs 9a, a plurality of second TFTs 9b and a plurality of capacitors 9c all disposed on the base coat film 11; and a flattening film 19a disposed on each first TFT 9a, each second TFT 9b, and each capacitor 9c.

The TFT layer 20a includes a plurality of gate lines 14 extending in parallel with each other in the lateral directions of the drawings, as illustrated in FIGS. 2 and 3. The TFT layer 20a also includes a plurality of source lines 18f extending in parallel with each other in the longitudinal direction of the drawings, as illustrated in FIGS. 2 and 3. The TFT layer 20a also includes a plurality of power-source lines 18g adjacent to the respective source lines 18f and extending in parallel with each other in the longitudinal directions of the drawings, as illustrated in FIGS. 2 and 3. In the TFT layer 20a, each sub-pixel P has the first TFT 9a, the second TFT 9b, and the capacitor 9c, as illustrated in FIG. 3.

The base coat film 11 is composed of an inorganic insulating monolayer film of, for instance, silicon nitride, silicon oxide or silicon oxide nitride, or is composed of an inorganic insulating laminated film of these materials.

The first TFT 9a is connected to the corresponding gate line 14 and source line 18f in each sub-pixel P, as illustrated in FIG. 3. The first TFT 9a includes the following components, as illustrated in FIG. 4: a semiconductor layer 12a disposed in the form of an island on the base coat film 11; a gate insulating film 13 disposed over the semiconductor layer 12a; a gate electrode 14a disposed on the gate insulating film 13 and partly overlapping the semiconductor layer 12a; a first interlayer insulating film 15 and a second interlayer insulating film 17 sequentially disposed over the gate electrode 14a; and a source electrode 18a and a drain electrode 18b spaced away from each other on the second interlayer insulating film 17.

The gate insulating film 13, the first interlayer insulating film 15, and the second interlayer insulating film 17 are composed of an inorganic insulating monolayer film of, for instance, silicon nitride, silicon oxide, or silicon oxide nitride, or is composed of an inorganic insulating laminated film of these materials.

The second TFT 9b is connected to the corresponding first TFT 9a and power-source line 18g in each sub-pixel P, as illustrated in FIG. 3. The second TFT 9b includes the following components, as illustrated in FIG. 4: a semiconductor layer 12b in the form of an island on the base coat film 11; the gate insulating film 13 disposed over the semiconductor layer 12b; a gate electrode 14b disposed on the gate insulating film 13 and partly overlapping the semiconductor layer 12b; the first interlayer insulating film 15 and the second interlayer insulating film 17 sequentially disposed over the gate electrode 14b; and a source electrode 18c and a drain electrode 18d spaced away from each other on the second interlayer insulating film 17.

Although the first TFTs 9a and the second TFTs 9b are top-gate TFTs in this embodiment by way of example, these TFTs may be bottom-gate TFTs.

The capacitor 9c is connected to the corresponding first TFT 9a and power-source line 18g in each sub-pixel P, as illustrated in FIG. 3. The capacitor 9c includes the following components, as illustrated in FIG. 4: a lower conductive layer 14c disposed in the same layer and made of the same material as the gate electrodes; the first interlayer insulating film 15 disposed over the lower conductive layer 14c; and an upper conductive layer 16 disposed on the first interlayer insulating film 15 and overlapping the lower conductive layer 14c.

In this embodiment, the flattening film 19a is made of an inexpensive organic resin material, such as acrylic resin or epoxy resin.

The organic EL element 30 includes the following components sequentially disposed on the flattening film 19a, as illustrated in FIG. 4: a plurality of first electrodes (reflective electrodes) 21, a plurality of organic EL layers 23, and a second electrode (transparent electrode) 24.

As illustrated in FIG. 4, the first electrodes 21 are arranged in matrix on the flattening film 19a as reflective electrodes so as to correspond to the sub-pixels P. As illustrated in FIG. 4, each first electrode 21 is connected to the drain electrode 18d of the corresponding second TFT 9b through a contact hole disposed in flattening film 19a. The first electrodes 21 are capable of injecting holes into the organic EL layers 23. The first electrodes 21 are more preferably made of a material having a large work function in order to improve the efficiency of hole injection into the organic EL layers 23. The first electrodes 21 are made of, for instance, a metal material, including silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 21 may be made of, for instance, an alloy of magnesium (Mg) and copper (Cu), an alloy of magnesium (Mg) and silver (Ag), an alloy of sodium (Na) and potassium (K), an alloy of astatine (At) and astatine oxide ($AtO_2$), an alloy of lithium (Li) and aluminum (Al), an alloy of lithium (Li), calcium (Ca) and aluminum (Al), or an alloy of lithium fluoride (LiF), calcium (Ca) and aluminum (Al). Alternatively, the first electrodes 21 may be made of a conductive oxide, such as tin oxide (SnO), zinc oxide (ZnO), indium tin oxide (ITO), or indium zinc oxide (IZO). The first electrodes 21 may be composed of a plurality of stacked layers made of the above materials. Here, examples of the material having a large work function include an indium tin oxide (ITO) and an indium zinc oxide (IZO).

An edge cover 22 is disposed in lattice and covers the perimeter of each first electrode 21, as illustrated in FIG. 4. The edge cover 22 is disposed between the light-emission regions Lr, Lg, and Lb, and separates the light-emission regions Lr, Lg, and Lb from each other.

The edge cover 22 is made of an organic resin material, such as polyimide resin, or spin-on-glass (SOG) resin. Alternatively, the edge cover 22 can be made of a material that emits a small amount of gas.

Here, gas emitted from the material refers to the amount of gas emitted after resin production, and a small amount of emitted gas refers to 5 ppm or less of emitted gas.

The plurality of organic EL layers 23 are disposed on the individual first electrodes 21 and arranged in matrix so as to correspond to the plurality of sub-pixels, as illustrated in FIG. 4. Each organic EL layer 23 includes the following layers sequentially disposed on the first electrode 21, as illustrated in FIG. 5: a hole injection layer 1, a hole transport layer 2, a light-emitting layer 3, an electron transport layer 4, and an electron injection layer 5.

The hole injection layer 1 is also called an anode buffer layer, and is capable of bringing the energy levels of the first electrode 21 and organic EL layer 23 close to each other to improve the efficiency of hole injection from the first electrode 21 to the organic EL layer 23. Examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 is capable of improving the efficiency of hole transport from the first electrode 21 to the organic EL layer 23. Examples of the material of the hole transport layer 2 include a porphyrin derivative, an aromatic tertiary amine compound, a styrylamine derivative, a polyvinylcarbazole, a poly-p-phenylenevinylene, a polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, a hydrogenated amorphous silicon, a hydrogenated amorphous silicon carbide, a zinc sulfide, and a zinc selenide.

The light-emitting layer 3 is a region where holes and electrons are injected from the first electrode 21 and the second electrode 24 upon voltage application via the first electrode 21 and the second electrode 24, and is a region where the holes and electrons rejoin. The light-emitting layer 3 is made of a material having high efficiency of light emission. Examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, a phenoxazone, a quinacridone derivative, a rubrene, a poly-p-phenylenevinylene, and a polysilane.

The electron transport layer 4 is capable of moving the electrons to the light-emitting layer 3 efficiently. The electron transport layer 4 is made of an organic compound, including an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, and a metal oxinoid compound.

The electron injection layer 5 is capable of bringing the energy levels of the second electrode 24 and organic EL layer 23 close to each other to improve the efficiency of electron injection from the second electrode 24 to the organic EL layer 23. This function can lower voltage for driving the organic EL element 30. The electron injection layer 5 is also called a cathode buffer layer. Herein, examples of the material of the electron injection layer 5 include an inorganic alkali compound (e.g., LiF or lithium fluoride, $MgF_2$ or magnesium fluoride, $CaF_2$ or calcium fluoride, $SrF_2$ or strontium fluoride, and $BaF_2$ or barium fluoride), an aluminum oxide ($Al_2O_3$). and a strontium oxide (SrO).

The second electrode 24 is disposed over the individual organic EL layers 23 and the edge cover 22, as illustrated in FIG. 4. The second electrode 24 is capable of injecting the electrons into the organic EL layers 23. The second electrode 24 is more preferably made of a material having a small work function, in order to improve the efficiency of electron injection into the organic EL layers 23. Here, examples of the material of the second electrode 24 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Alternatively, the second electrode 24 may be made of, for instance, an alloy of magnesium (Mg) and copper (Cu), an alloy of magnesium (Mg) and silver (Ag), an alloy of sodium (Na) and potassium (K), an alloy of astatine (At) and astatine oxide ($AtO_2$), an alloy of lithium (Li) and aluminum (Al), an alloy of lithium (Li), calcium (Ca) and aluminum (Al), or an alloy of lithium fluoride (LiF), calcium (Ca) and aluminum (Al). Alternatively, the second electrode 24 may be made of a conductive oxide, such as tin oxide (SnO), zinc oxide (ZnO), indium tin oxide (ITO), or indium zinc oxide (IZO). Alternatively, the second electrode 24 may be composed of a plurality of stacked layers made of the above materials. Examples of the material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

The organic EL display device 50a includes a sealing film 28 covering the organic EL element 30, as illustrated in FIG. 4. The sealing film 28 includes the following films: a first inorganic film 25 disposed over the second electrode 24; an organic film 26 disposed over the first inorganic film 25; and a second inorganic film 27 disposed over the organic film 26. The sealing film 28 is capable of protecting the organic EL layers 23 from moisture and oxygen.

The first inorganic film 25 and the second inorganic film 27 are made of, for instance, an inorganic material, such as silicon oxide ($SiO_2$), aluminum oxide ($Al_2O_3$), silicon nitride (SiNx, where x is a positive numeral; an example of silicon nitride is $Si_3N_4$ or trisilicon tetranitride), or silicon carbonitride (SiCN). The organic film 26 is made of, for instance, an organic material, such as acrylate, polyurea, parylene, polyimide, or polyamide.

In this embodiment, the frame region F includes a plurality of mask spacers 37, as illustrated in FIG. 4. The mask spacers 37 are made of the same material as the edge cover 22, and are disposed on the flattening film 19a via a metal layer 21' disposed in the same layer and made of the same material as the first electrodes 21.

In this embodiment, the flattening film 19a has a recess (slit) S disposed between the display region D and the mask spacer 37 adjacent to the display region D (i.e., the mask spacer 37 on the left side of FIG. 4), as illustrated in FIG. 4. The recess S is filled with the organic film (i.e., an organic resin material) 26.

In cross-sectional view, the recess S is substantially rectangular, as illustrated in FIG. 4. In plan view, the recess S has a straight-line shape surrounding the display region D, and is disposed all around the display region D.

The recess S allows the organic resin material (application ink), which constitutes the organic film 26 after ejected through ink jetting, to easily accumulate in the recess S and to easily spread from the recess S toward the display region D.

The mask spacers 37 allows the organic resin material, which constitutes the organic film 26 after ejected through ink jetting, to accumulate in the region where the mask spacers 37 are located; hence, the organic resin material easily spreads from the recess S toward the display region D via the recess S filled with the organic film 26.

That is, in this embodiment, the frame region F includes the mask spacers 37; in addition, the flattening film 19a has the recess S disposed between the display region D and the mask spacer adjacent to the display region D; in addition, the recess S is filled with the organic film 26. This configuration can improve the spread of the organic resin material when the organic film 26 is formed through ink jetting, thereby preventing chipping in the organic film 26.

As illustrated in FIG. 4, the frame region F has a monolithic gate driver region (GDM region) 38 where a driver TFT (not shown) is disposed, and the recess S is disposed between the display region D and the monolithic gate driver region 38.

As illustrated in FIG. 4, the flattening film 19a has a trench 40 disposed more remotely from the display region D than the recess S is, and the mask spacers 37 are arranged between the trench 40 and the recess S. The trench 40 is not disposed in a location facing the terminal section T and is disposed in an angular U-shape, as illustrated in FIG. 1.

The second electrode 24 and the metal layer 21' are in contact and electrically connected to each other in the trench 40, as illustrated in FIG. 4.

The recess S has a width $W_1$, and the trench 40 has a width $W_2$. The width $W_1$ of the recess S is set to be larger than the width $W_2$ of the trench 40 (i.e., $W_1 > W_2$), as illustrated in FIG. 4. To be specific, the width $W_1$ of the recess S is 30 μm for instance, and the width $W_2$ of the trench 40 is 5 μm for instance. Such a greater width $W_1$ of the recess S allows the organic resin material (application ink) to easily accumulate in the recess S. This can improve the spread of the organic resin material, thereby preventing chipping in the organic film 26.

The organic EL display device 50a according to this embodiment includes first and second blockage walls Wa and Wb disposed in the frame region F (blockage region C, as illustrated in FIG. 6. The first blockage wall Wa surrounds the display region D, and the second blockage wall Wb surrounds the first blockage wall Wa.

As illustrated in FIG. 6, the first blockage wall Wa is in contact with the edge of the organic film 26, which forms the sealing film 28, via the first inorganic film 25, which forms the sealing film 28, and the first blockage wall Wa overlaps the edge of the organic film 26. The first blockage wall Wa is made of the same material as the edge cover 22.

As illustrated in FIG. 6, the second blockage wall Wb is in contact with the edge of the organic film 26 via the first inorganic film 25, and overlaps the distal end at the edge of the organic film 26. The second blockage wall Wb is made of the same material as the edge cover 22.

A method for manufacturing the organic EL display device 50a according to this embodiment will be described. The method for manufacturing the organic EL display device 50a in this embodiment includes a step of forming an organic EL element, and a step of forming a sealing film.

Step of Forming Organic EL Element

For instance, using a known method, the TFT layer 20a including the base coat film 11, the organic EL element 30 (i.e., the first electrode 21, the organic EL layer 23 including the hole injection layer 1, the hole transport layer 2, the light-emitting layer 3, the electron transport layer 4 and the electron injection layer 5, and the second electrode 24), the edge cover 22, the first blockage wall Wa, and the second blockage wall Wb are formed onto a surface of the base substrate 10 of polyimide resin.

Here, the recess S and the trench 40 are formed in the flattening film 19a when the flattening film 19a is formed so as to cover a plurality of switching elements (i.e., the first TFT 9a and the second TFT 9b) on the base substrate 10.

To be more specific, the flattening film 19a having the recess S and the trench 40 and having a thickness of, for instance, 2 μm is formed through the following process steps: applying photosensitive acrylic resin, through spin coating, onto the base substrate 10 provided with the first TFT 9a and the second TFT 9b; then exposing the base substrate 10 at a predetermined amount of exposure (e.g., 150 mJ/cm$^2$) using an exposure mask having a predetermined exposure pattern; and then developing the base substrate 10 using an alkali development solution. The base substrate 10 after development undergoes post-baking under a predetermined condition (e.g., at 220° C. for 60 minutes).

As illustrated in FIG. 4, the metal layer 21' and the second electrode 24 are formed on a surface of the trench 40, and the metal layer 21' and the second electrode 24 are electrically connected together in the trench 40.

The mask spacers 37 are made of the same material as the edge cover 22, as earlier described. The mask spacers 37 are simultaneously formed onto a surface of the metal layer 21' as well, as illustrated in FIG. 4, when the edge cover 22 is formed so as to cover the perimeter of the first electrode 21 after the formation of the first electrode 21. The mask spacers 37 are formed onto the flattening film 19a in the frame region F disposed more remotely from the display region D than the recess S is, as illustrated in FIG. 4.

Step of Forming Sealing Film

First, the first inorganic film 25 is formed by depositing an inorganic insulating film of, for instance, silicon nitride to a thickness of about several ten nanometers to several micrometers through plasma chemical vapor deposition (CVD) so as to cover the organic EL element 30 as formed in the step of forming an organic EL element. At this stage, the first inorganic film 25 is formed onto a surface of the recess S, onto a surface of the second electrode 24 on the surface of the trench 40, and onto surfaces of the mask spacers 37.

Subsequently, the organic film 26 is formed onto a surface of the first inorganic film 25 by ejecting an organic resin material of, for instance, acrylate all over the substrate surface provided with the first inorganic film 25, to a thickness of about several micrometers to several ten micrometers through ink jetting.

At this stage, an application frequency f is expressed by Expression (1) below, where p denotes nozzle pitch in the ink jetting, where V denotes ejection volume per drop, where v denotes scanning rate in the ink jetting, where n denotes the number of scanning times in the ink jetting (i.e., the number of times of drop into the application region), where t denotes a desired thickness of the organic film 26.

[Expression 1]

$$f = pvt/(nV) \tag{1}$$

For p=70 μm, V=10 pl, v=1 [m/s], n=4 times, and t=10 μm, the application frequency is 17.5 kHz, at which the organic resign material needs to be ejected.

Figure 7:
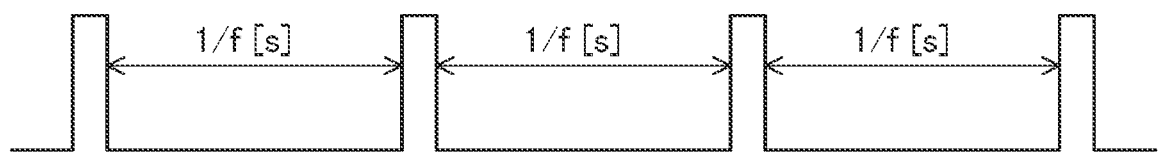
FIG. 7 is a chart illustrating the timing of ejecting an organic resin material through ink jetting, according to the first embodiment.
Figure 8:
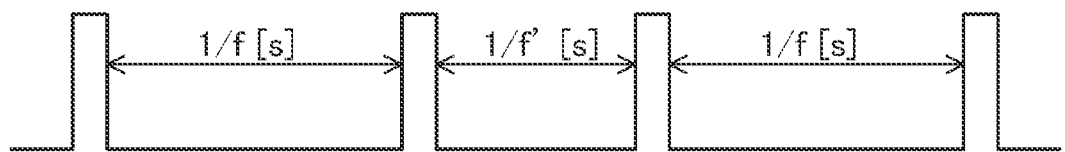
FIG. 8 is a chart illustrating the timing of ejecting the organic resin material through ink jetting, according to the first embodiment.

In the present disclosure, to avoid chipping in the organic film 26, the organic resin material is designed to land in the recess S when ejected with an inkjet device being scanned. In the above example for instance, the organic resin material is ejected at a constant timing of 1/f=57 μs in a normal region except a region where the recess S is located, as illustrated in FIG. 7. In addition, when the inkjet device passes through the recess S, this ejection timing changes to a timing shorter than 1/f so that the organic resin material lands in the recess S; as illustrated in FIG. 8 for instance, the ejection timing changes to 1/f' (1/f'>1/f) in the region where the recess S is located, and then changes back to the normal timing of 1/f again. Reading an encoder installed in the inkjet device while scanning the inkjet device generates the ejection timing, thereby accurately controlling the landing location.

Figure 9:
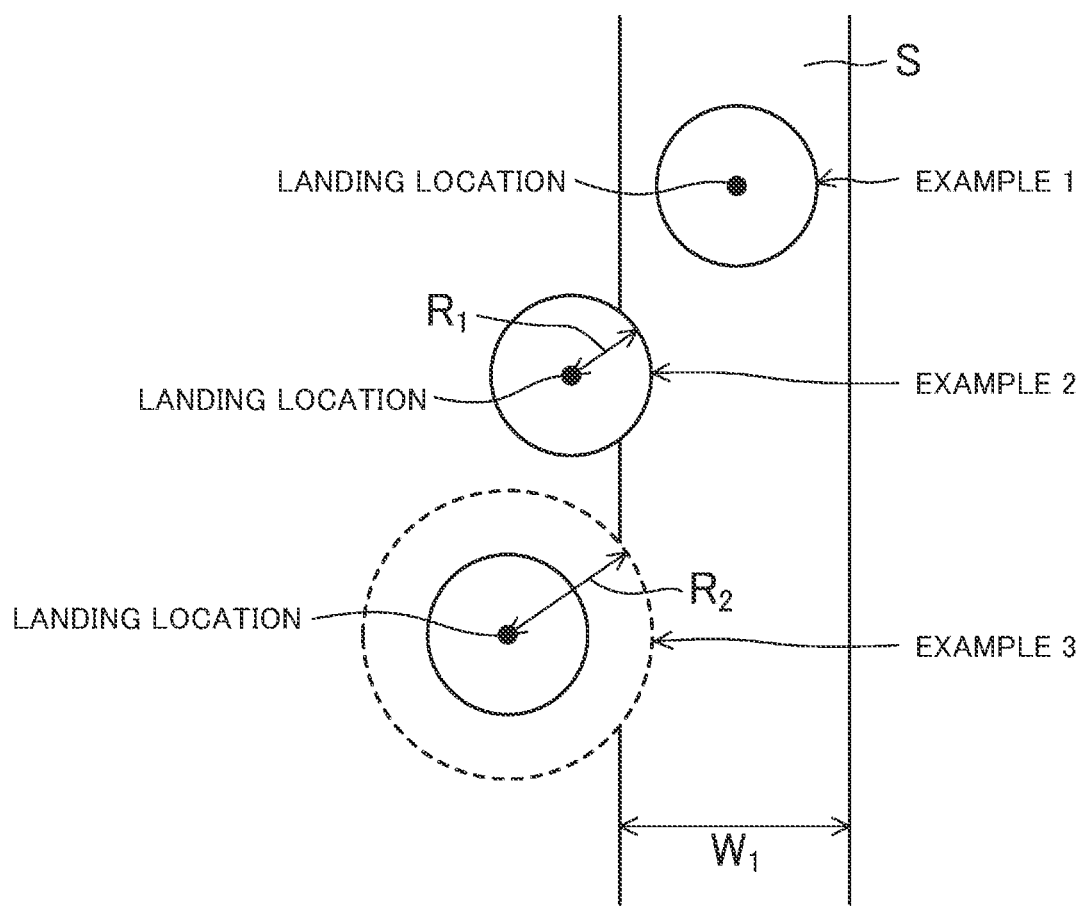
FIG. 9 illustrates landing locations of the organic resin material in ink jetting, according to the first embodiment.

Ink droplets need to be ejected in such a manner that the landing location of the organic resin material is set inside the recess S, as illustrated in FIG. 9 (c.f., Example 1). Alternatively, the landing location needs to set within a radius $R_1$ of a droplet from the recess S, as illustrated in FIG. 9 (c.f., Example 2). Moreover, for an application volume of radius 10 pl of a droplet, the radius of a droplet is about 13 μm. In this case, the landing location needs to be set within 13 μm from the recess S, or needs to be set, at most, within a landing radius $R_2$ of a droplet from the recess S (c.f., Example 3). In any of these examples, the organic resin material lands in the recess S, and the recess S functions as pinning of droplets, thereby avoiding chipping in the organic film 26.

In this embodiment, the organic resin material is at this stage firstly ejected into not the recess S but both the display region D and the frame region F to form the organic film 26.

Furthermore, the substrate provided with the organic film 26 undergoes plasma CVD to grow an inorganic insulating film of, for instance, silicon nitride to a thickness of about several ten nanometers to several micrometers to form the second inorganic film 27, thus forming the sealing film 28 consisting of the first inorganic film 25, the organic film 26, and the second inorganic film 27.

The organic EL display device 50a according to this embodiment can be manufactured through these process steps.

Other Embodiments

Figure 10:
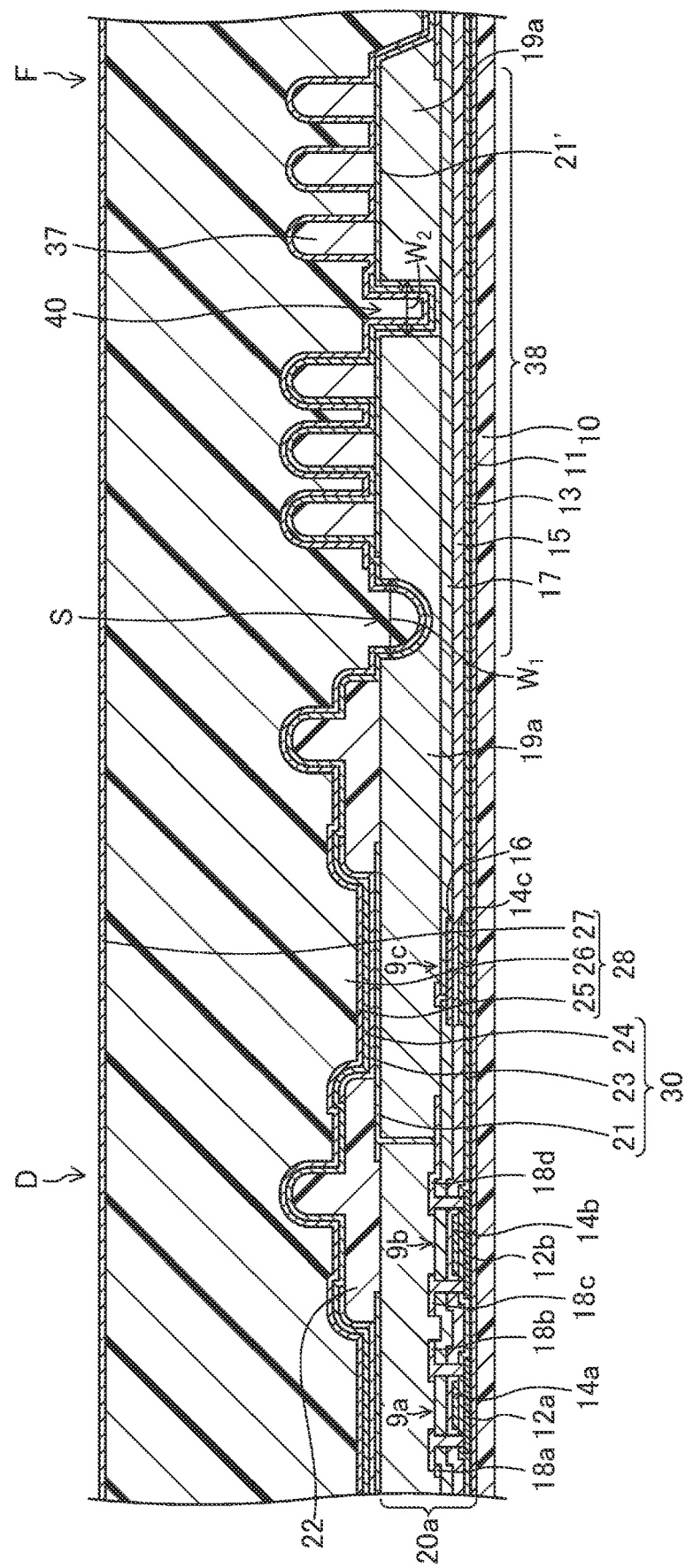
FIG. 10 is a cross-sectional view of a modified recess of the organic EL display device.
Figure 11:
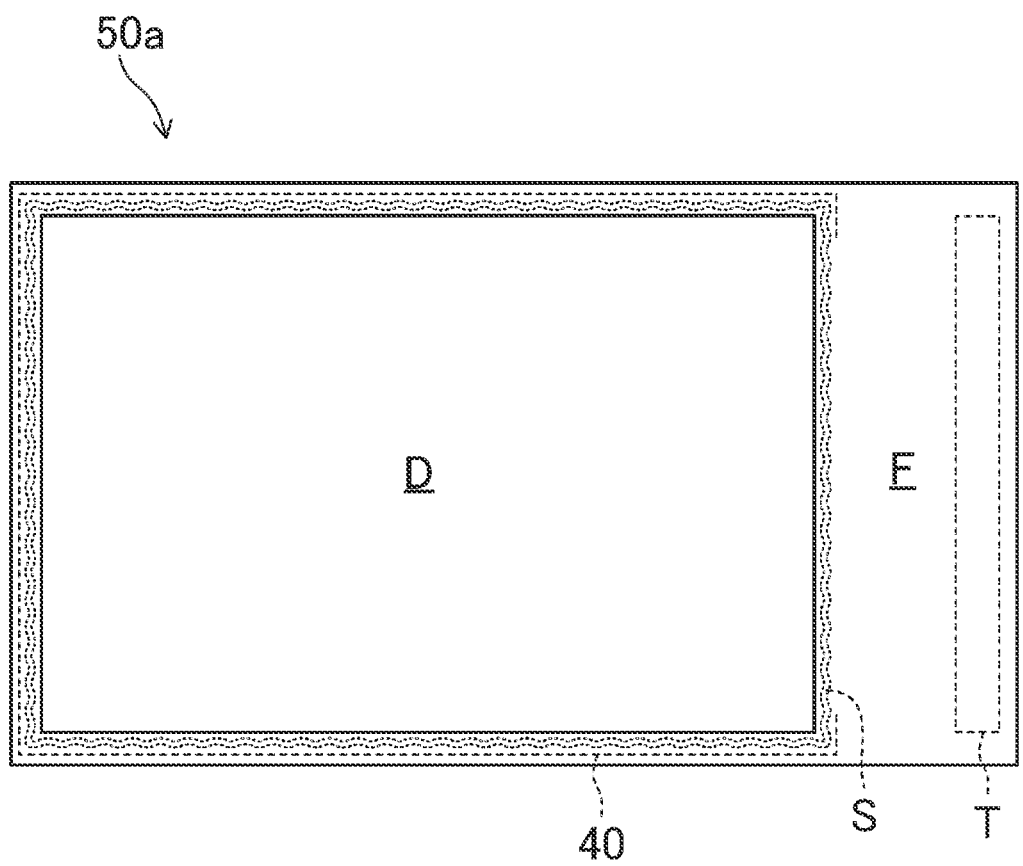
FIG. 11 is a plan view of the modified recess of the organic EL display device.

As illustrated in FIG. 10, the recess S may be a dimple disposed on a surface of the flattening film 19a and having a substantially semicircular shape (i.e., a dimple shape) in cross-sectional view. Alternatively, the recess S may be provided in the form of a wavy line surrounding the display region D in plan view, as illustrated in FIG. 11. Such a configuration can offer an effect similar to that offered by the foregoing embodiment.

When ejected through ink jetting, the organic resin material may be firstly ejected into the recess S to fill the recess S with the organic resin material (i.e., the organic film 26).

The foregoing embodiment has described, by way of example, the organic EL display device 50a includes an organic EL layer having a five-ply stack of a hole injection layer, a hole transport layer, a light-emitting layer, an electron transport layer and an electron injection layer. In some embodiments, an organic EL layer may be provided that has a three-ply stack of a hole injection-and-transport layer, a light-emitting layer and an electron transport-and-injection layer.

The foregoing embodiment has described, by way of example, an organic EL display device that has a first electrode as an anode and a second electrode as a cathode. The present disclosure is also applicable to an organic EL display device in which an organic EL layer has an inverted stack of layers: the first electrode as a cathode and the second electrode as an anode.

The foregoing embodiment has described, by way of example, an organic EL display device that includes, as a source electrode, an electrode of a TFT connected to the first electrode. The present disclosure is also applicable to an organic EL display device that includes, as a drain electrode, an electrode of a TFT connected to the first electrode.

The foregoing embodiment has described an organic EL display device as a display device by way of example. The present disclosure is applicable to a display device that includes a plurality of light-emitting elements driven by current, such as a display device that includes QLEDs or quantum-dot light-emitting diodes, which are light-emitting elements using a layer containing quantum dots.

INDUSTRIAL APPLICABILITY

As described above, the present disclosure is useful for a display device, such as an organic EL display device.

The invention claimed is:

1. A display device comprising:
    a base substrate;
    a plurality of switching elements disposed on the base substrate;
    a flattening film disposed on the plurality of switching elements;
    a light-emitting element disposed on the flattening film;
    a sealing film disposed over the light-emitting element, the sealing film comprising a stack of, in sequence, a first inorganic film, an organic film, and a second inorganic film; and
    a display region and a frame region disposed around the display region,
    wherein the frame region includes a plurality of mask spacers,
    the flattening film has a recess disposed between the display region and the plurality of mask spacers adjacent to the display region,
    the recess is filled with the organic film,
    the frame region includes a monolithic gate driver region, and
    the recess is disposed between the display region and the monolithic gate driver region.

2. The display device according to claim 1, wherein the light-emitting element includes first and second electrodes, the flattening film has a trench disposed more remotely from the display region than the recess is, and in the trench, the second electrode is in contact with a metal layer disposed in the same layer and made of the same material as the first electrode.

3. The display device according to claim 2, wherein the plurality of mask spacers are disposed between the trench and the recess.

4. The display device according to claim 2, wherein the recess has a width greater than a width of the trench.

5. The display device according to claim 1, wherein the recess is provided in a form of a frame surrounding the display region.

6. The display device according to claim 1, wherein the light-emitting element is an organic EL element.

7. A method for manufacturing a display device,
the display device including
a base substrate,
a plurality of switching elements disposed on the base substrate,
a flattening film disposed on the plurality of switching elements,
a light-emitting element disposed on the flattening film,
a sealing film disposed over the light-emitting element, the sealing film comprising a stack of, in sequence, a first inorganic film, an organic film, and a second inorganic film, and
a display region and a frame region disposed around the display region,
the method comprising at least:
forming a recess in the flattening film when forming the flattening film so as to cover the plurality of switching elements disposed on the base substrate;
forming a plurality of mask spacers onto the flattening film, in the frame region disposed more remotely from the display region than the recess is;
forming the first inorganic film onto a surface of the recess and surfaces of the plurality of mask spacers; and
ejecting, through ink jetting, an organic resin material all over a surface of the base substrate provided with the first inorganic film, to form the organic film onto a surface of the first inorganic film and to fill the recess with the organic resin material, wherein
the filling comprises
when an inkjet passes through the recess, changing an ejection timing in such a manner that the organic resin material lands in the recess,
the ejection timing is defined by an application frequency f expressed by Expression 1 as follows, and
the ejection timing equals 1/f in a normal region except a region where the recess is located, and the ejection timing is shorter than 1/f in the region where the recess is located:

[Expression 1]

$$f = pvt/(nV) \qquad (1),$$

where p denotes a nozzle pitch in the ink jetting, where V denotes an ejection volume per drop, where v denotes a scanning rate in the ink jetting, where n denotes a number of scanning times in the ink jetting, which is a number of times of dropping into an application region, where t denotes a desired thickness of the organic film.

8. The method according to claim 7, wherein after the inkjet passes through the recess, the ejection timing changes back to 1/f.

9. The method according to claim 7, wherein forming the organic film comprises
firstly ejecting the organic resin material into the recess to fill the recess with the organic resin material.

10. The method according to claim 7, wherein the light-emitting element is an organic EL element.

* * * * *